US011390947B2

(12) United States Patent
Deepak et al.

(10) Patent No.: US 11,390,947 B2
(45) Date of Patent: Jul. 19, 2022

(54) METHOD OF FORMING A FLUORINATED METAL FILM

(71) Applicant: Applied Materials, Inc., Santa Clara, CA (US)

(72) Inventors: Nitin Deepak, Mumbai (IN); Suresh Chand Seth, Mumbai (IN); Prerna Sonthalia Goradia, Mumbai (IN); Geetika Bajaj, New Delhi (IN); Darshan Thakare, Thane West (IN); Jennifer Y. Sun, Mountain View, CA (US); Gayatri Natu, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 142 days.

(21) Appl. No.: 16/800,310

(22) Filed: Feb. 25, 2020

(65) Prior Publication Data

US 2020/0283897 A1  Sep. 10, 2020

Related U.S. Application Data

(60) Provisional application No. 62/813,512, filed on Mar. 4, 2019.

(51) Int. Cl.
*C23C 16/40* (2006.01)
*C23C 16/455* (2006.01)
(Continued)

(52) U.S. Cl.
CPC ........ *C23C 16/45553* (2013.01); *C23C 16/08* (2013.01); *C23C 16/40* (2013.01); *C23C 16/45536* (2013.01); *C23C 22/34* (2013.01)

(58) Field of Classification Search
CPC ......... C23C 16/06; C23C 16/08; C23C 16/40; C23C 16/45536; C23C 16/45553
See application file for complete search history.

(56) References Cited

U.S. PATENT DOCUMENTS

2004/0234704 A1  11/2004  Garg et al.
2011/0159204 A1   6/2011  Dickey et al.
(Continued)

FOREIGN PATENT DOCUMENTS

JP  2008-78253  *  4/2008  ............. H01L 29/78

OTHER PUBLICATIONS

Gnedenkov, S.V., et al., "Composite coatings formed on the PEO-layers with the use of solutions of tetrafluoroethylene telomers". Surface and Coatings Technology 346 (2018) 53-62.*
(Continued)

*Primary Examiner* — Bret P Chen
(74) *Attorney, Agent, or Firm* — Patterson + Sheridan, LLP (57) ABSTRACT

A method of forming a fluorinated metal film is provided. The method includes positioning an object in an atomic layer deposition (ALD) chamber having a processing region, depositing a metal-oxide containing layer on an object using an atomic layer deposition (ALD) process, depositing a metal-fluorine layer on the metal-oxide containing layer using an activated fluorination process, and repeating the depositing the metal-oxide containing layer and the depositing the metal-oxide containing layer until a fluorinated metal film with a predetermined film thickness is formed. The activated fluorination process includes introducing a first flow of a fluorine precursor (FP) to the processing region. The FP includes at least one organofluorine reagent or at least one fluorinated gas.

18 Claims, 4 Drawing Sheets

(51) Int. Cl.
  *C23C 22/34* (2006.01)
  *C23C 16/08* (2006.01)

(56) References Cited

U.S. PATENT DOCUMENTS

| | | | | |
|---|---|---|---|---|
| 2012/0308739 | A1* | 12/2012 | Lansalot-Matras | C23C 16/30 427/255.39 |
| 2017/0233287 | A1* | 8/2017 | Li | C03C 3/108 428/172 |
| 2017/0330743 | A1* | 11/2017 | Chalker | H01L 21/0228 |
| 2018/0003535 | A1* | 1/2018 | Rick | G01F 1/66 |
| 2018/0112311 | A1 | 4/2018 | Fenwick et al. | |
| 2018/0202047 | A1 | 7/2018 | Lin et al. | |
| 2018/0327898 | A1* | 11/2018 | Wu | C23C 16/45525 |
| 2019/0078199 | A1* | 3/2019 | Wu | C23C 16/30 |
| 2019/0078206 | A1* | 3/2019 | Wu | C01F 17/218 |

OTHER PUBLICATIONS

Okazoe, Takashi, et al., "Overview on the history of organofluorine chemistry from the viewpoint of material industry". Proc. Jpn. Acad., Ser. B 85 (2009) pp. 276-289.*

Kim, Min Su, et al., "Effect of seasoning-layer stress on fluorine diffusion". AIP Advances 10, 085103 (2020), pp. 1-7.*

Ylilammi, M. et al., "Metal Fluoride Thin Films Prepared by Atomic Layer Deposition". J. Electrochem. Soc., vol. 141, No. 5, May 1994, 1278-1284.*

Lee, Younghee, et al., "Atomic Layer Deposition of Metal Fluorides Using HF-Pyridine as the Fluorine Precursor". Chemistry of Materials, 2016, 28, 2022-2032.*

Putkonen, Matti, et al., "Atomic layer deposition of metal fluorides through oxide chemistry". J. Mater. Chem., 2011, 21, 14461-14465.*

Singh, Joseph A., et al., "Area-Selective Atomic Layer Deposition of Metal Oxides on Noble Metals through Catalytic Oxygen Activation". Chemistry of Materials, 2018, 30, 663-670.*

Mahuli, Neha, et al., "Atomic layer deposition of aluminum oxyfluoride thin films with tunable stoichiometry". J. Vac. Sci. Technol. A 38, 022407 (2020) pp. 1-10.*

International Search Report/Written Opinion issued to PCTNUS2020/019954 dated Jun. 19, 2020.

* cited by examiner

METHOD OF FORMING A FLUORINATED METAL FILM

CROSS-REFERENCE TO RELATED APPLICATIONS

This application claims priority to U.S. Provisional Patent Application Ser. No. 62/813,512, filed on Mar. 4, 2019, which herein is incorporated by reference.

BACKGROUND

Field

Embodiments of the present disclosure generally relate to a method of forming a fluorinated metal film. More particularly, embodiments of the present disclosure relate to coating components with the method of forming the fluorinated metal film.

Description of the Related Art

In the cleaning or manufacturing of semiconductor, OLED, and flat panel devices, such as substrates, chamber components, chamber tools, chambers, and chamber mainframes, it is often desirable to form a fluorinated coating on the devices. Absent the fluorinated coating, halogenated plasma during semiconductor, OLED, and flat panel processing may corrode the surfaces of the semiconductor, OLED, and flat panel devices. The corrosion of the surfaces that may be present could impact semiconductor, OLED, and flat panel performance and impact product yield, chamber uptime, and customers cost.

Most current fluorinating coating techniques utilize materials, such as HF-pyridine and fluorine, that do not provide precise control of properties of the fluorinated coating. Accordingly, what is needed in the art is an improved method of forming a fluorinated coating.

SUMMARY

In one embodiment, a method of forming a fluorinated metal film is provided. The method includes positioning an object in an atomic layer deposition (ALD) chamber having a processing region, depositing a metal-oxide containing layer on an object using an ALD process, depositing a metal-fluorine layer on the metal-oxide containing layer using an activated fluorination process, and repeating the depositing the metal-oxide containing layer and the depositing the metal-oxide containing layer until a fluorinated metal film with a predetermined film thickness is formed. The activated fluorination process includes introducing a first flow of a fluorine precursor (FP) to the processing region. The FP includes at least one organofluorine reagent or at least one fluorinated gas.

In another embodiment, a method of forming a fluorinated metal film is provided. The method includes depositing a metal-oxide containing layer on an object using a metal-oxide containing layer atomic layer deposition (ALD) process, depositing a metal-fluorine layer on the metal-oxide containing layer using an activated fluorination process, and repeating the depositing the metal-oxide containing layer and the depositing the metal-oxide containing layer until a fluorinated metal film with a predetermined film thickness is formed. The ALD process includes positioning the object in an ALD chamber having a processing region, introducing a first flow of an oxygen-containing precursor to the processing region introducing a second flow of a metal-containing precursor to the processing region, and repeating the introducing the first flow of the oxygen-containing precursor and the second flow of the metal-containing precursor until the metal-oxide containing layer with a predetermined layer thickness is formed. The activated fluorination process includes introducing a third flow of a fluorine precursor (FP) to the processing region and introducing a fourth flow of a fluorination activation precursor (FAP) to the processing region. The FP includes at least one organofluorine reagent or at least one fluorinated gas.

In yet another embodiment, a method of forming a fluorinated metal film is provided. The method includes depositing a metal-oxide containing layer on an object using a metal-oxide containing layer atomic layer deposition (ALD) process, depositing a metal-fluorine layer on the metal-oxide containing layer using an activated fluorination process, and repeating the depositing the metal-oxide containing layer and the depositing the metal-oxide containing layer until a fluorinated metal film with a predetermined film thickness is formed. The ALD process includes positioning the object in an ALD chamber having a processing region, introducing a first flow of a yttrium-containing precursor to the processing region, introducing a second flow of an oxygen-containing precursor to the processing region and repeating the introducing the first flow of the yttrium-containing precursor and the introducing the second flow of the oxygen-containing precursor, until the metal-oxide containing layer with a predetermined layer thickness is formed. The activated fluorination process includes introducing a third flow of a fluorine precursor (FP) to the processing region and introducing a fourth flow of a fluorination activation precursor (FAP) to the processing region. The FP includes at least one organofluorine reagent or at least one fluorinated gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a method of forming a fluorinated metal film. The method includes depositing a metal-oxide containing layer on an object using an atomic layer deposition (ALD) process, depositing a metal-fluorine layer on the metal-oxide containing layer using an activated fluorination process, and repeating depositing the metal-oxide containing layer and depositing the metal-oxide containing layer until a fluorinated metal film with a predetermined film thickness is formed.

Figure 1:
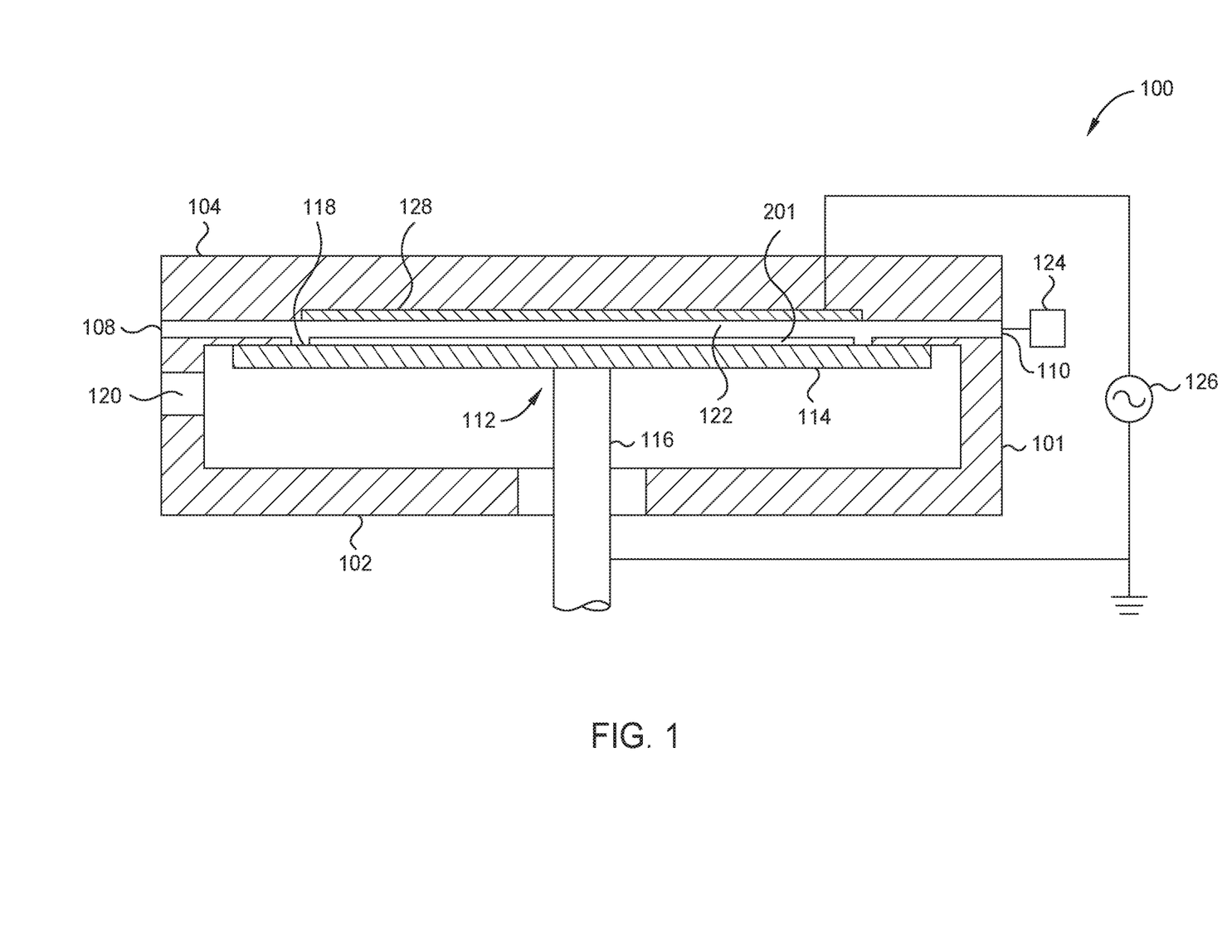
FIG. 1 is a schematic view of an atomic layer deposition chamber according to an embodiment.

FIG. 1 is a schematic view of an atomic layer deposition (ALD) chamber 100. It is to be understood that the chamber described below is an exemplary chamber and other chambers, including chambers from other manufacturers, may be used with or modified to accomplish aspects of the present disclosure, such a method 200 of forming a fluorinated metal film 300.

The ALD chamber 100 includes a chamber body 101. The chamber body includes a body portion 102, and a lid portion 104, and a support assembly 112. An inlet 108 and an outlet 110 disposed between the body portion 102 and lid portion 104 of the chamber body 101. The support assembly 112 is at least partially disposed within the body portion 102 of the chamber body 101. The support assembly 106 includes a pedestal 114 movably disposed in the chamber body 101 by a stem 116. The pedestal 114 includes a support surface 118 configured to support an object 301, described in further detail herein. The stem 116 extends through the chamber body 101 and is connected to a lift system (not shown) that moves the pedestal 114 between a processing position (as shown) and a transfer position. The transfer position facilitates transfer of the object 301 through an opening 120 formed in a sidewall of the body portion 102 to provide access to the interior of the ALD chamber 100.

In the processing position, the pedestal 114 of the support assembly 112 contacts the body portion 102 to form a processing region 122 defined by the support surface 118, a upper surface of the body portion 102, and a lower surface of the lid portion 104. When the support assembly 112 in the processing position contacts the body portion 102 to form a processing region 122, the inlet 108 and the outlet 110 are fluid communication with the processing region 122. In this manner, gas is provided to the processing region 122 through the inlet 108. Gas flows in the processing region 122 across the object 301 and is exhausted through the outlet 110 by a pump 124. An RF (radio frequency) source 126 is coupled an electrode 128 of the lid portion 104. The RF source 126 powers the electrode 128 to facilitate generation of plasma from gas in the processing region 122. The pedestal 114 is grounded or the pedestal 114 may serve as a cathode when connected to the RF source 126 to generate a capacitive electric field between the lower surface of the lid portion 104 and the pedestal 114 to accelerate plasma species toward the object 301.

Figure 2:
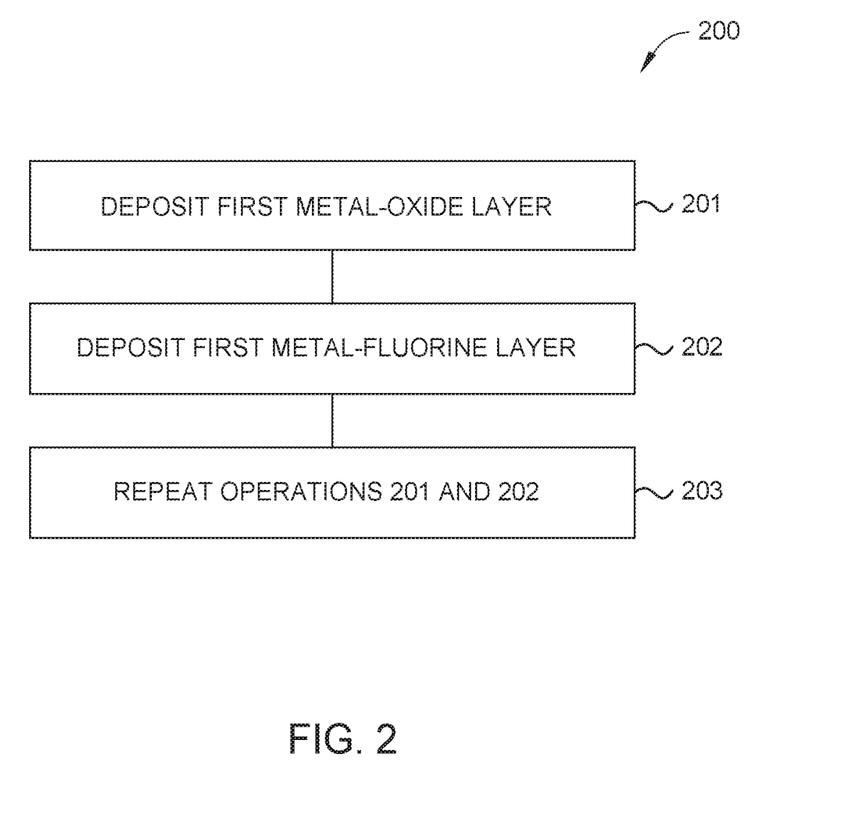
FIG. 2 is a flow diagram illustrating operations of the method of forming a fluorinated metal film according to an embodiment.
Figure 3A:
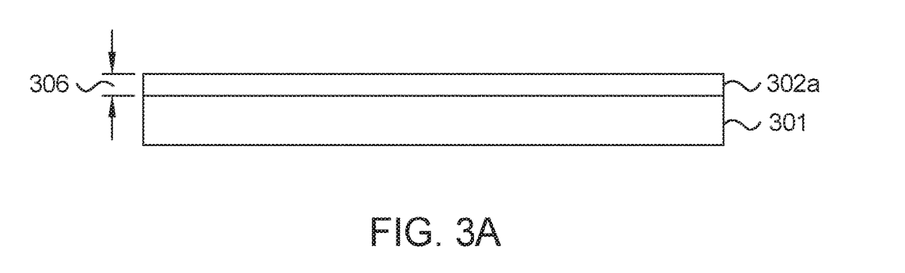
FIGS. 3A-3C are schematic, cross-sectional views of a substrate during a method of forming a fluorinated metal film according to an embodiment.
Figure 3B:
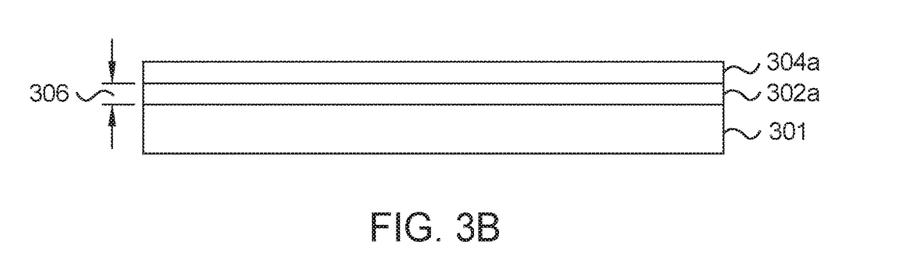
Figure 3C:
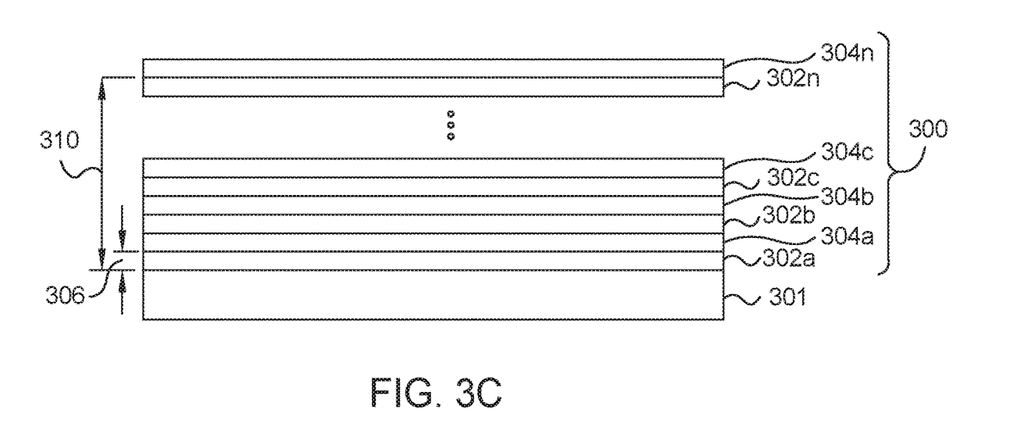

FIG. 2 is a flow diagram illustrating operations of the method 200 of forming the fluorinated metal film 300, as shown in FIGS. 3A-3C. To facilitate explanation, FIG. 1 will be described with reference to FIG. 1, FIGS. 3A-3C, and FIG. 4, a schematic illustration of an activated fluorination process utilized in the method 200. However, it is to be noted that an ALD chamber other than ALD chamber 100 of FIG. 1 may be utilized in conjunction with the method 200.

At operation 201, a first metal-oxide containing layer 302a is deposited on an object 301 utilizing an ALD process. The object 301 may be a substrate, chamber component, chamber tool, chamber, and chamber mainframe. In embodiments, which can be combined with other embodiments described herein, a metal of the first metal-oxide containing layer includes at least one of yttrium (Y), aluminum (Al), calcium (Ca), magnesium (Mg), strontium (Sr), barium (Ba), scandium (Sc), zinc (Zn), tin (Sn), gallium (Ga), indium (In), vanadium (V), manganese (Mn), cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), zirconium (Zr), or hafnium (Hf). The ALD process includes transferring the object 301 in the ALD chamber 100 and positioning the object 301 on the pedestal 114. The first metal-oxide containing layer 302a deposited utilizing the ALD process has a predetermined layer thickness 306.

In one embodiment, which can be combined with other embodiments described herein, the ALD process depositing a first metal-oxide containing layer 302a of $Y_2O_3$ includes introducing a flow of yttrium-containing precursor to the processing region 122. The yttrium-containing precursor flowing across the processing region 122 flows across the object 301 and from an yttrium-containing layer on the object 301. A flow of oxygen-containing precursor is provided to the processing region 122. In one embodiment, which can be combined with other embodiments described herein, the oxygen-containing precursor includes $H_2O$, $O_3$ or $O_2$. In one embodiment, which can be combined with other embodiments described herein the oxygen-containing precursor flowing across the processing region 122 flows across the object 301 and is activated into a plasma to form oxygen radicals. In another embodiment, which can be combined with other embodiments described herein, the oxygen radicals may be formed in a remote plasma source that provides the oxygen radicals to the processing region 122. In the embodiments where the oxygen radicals are formed, the oxygen radicals react with the layer of yttrium on the object 301, forming a layer of $Y_2O_3$ on the object 301. Repetition of the flowing yttrium-containing precursor, the flowing oxygen-containing precursor, and, in some embodiments, the activating oxygen-containing precursor into a plasma continues until a first metal-oxide containing layer 302a of $Y_2O_3$ having the predetermined layer thickness 306 is formed.

In another embodiment, which can be combined with other embodiments described herein, the ALD process depositing a first metal-oxide containing layer 302a of $Al_2O_3$ includes introducing a flow of oxygen-containing precursor to the processing region 122. In one embodiment, which can be combined with other embodiments described herein, the oxygen-containing precursor includes $O_2$. The oxygen-containing precursor flowing across the processing region 122 flows across the object 301 and is activated into a plasma to form oxygen radicals. In another embodiment, which can be combined with other embodiments described herein, the oxygen radicals may be formed in a remote plasma source that provides the oxygen radicals to the processing region 122. In the embodiments where the oxygen radicals are formed, the oxygen radicals react with and deposit a layer of oxygen on the object 301. A flow of aluminum-containing precursor, such as trimethylaluminium $(CH_3)_3Al$ (TMA), is provided to the processing region 122. The aluminum-containing precursor flowing across the processing region 122 flows across the object 301, reacts with the layer of oxygen on the object 301, and forms a layer of $Al_2O_3$ on the object 301. Repetition of the flowing oxygen-containing precursor, in some embodiments, the activating oxygen-containing precursor into a plasma, and the flowing aluminum-containing precursor continues until a first metal-oxide containing layer 302a of $Al_2O_3$ having the predetermined layer thickness 306 is formed.

Figure 4:
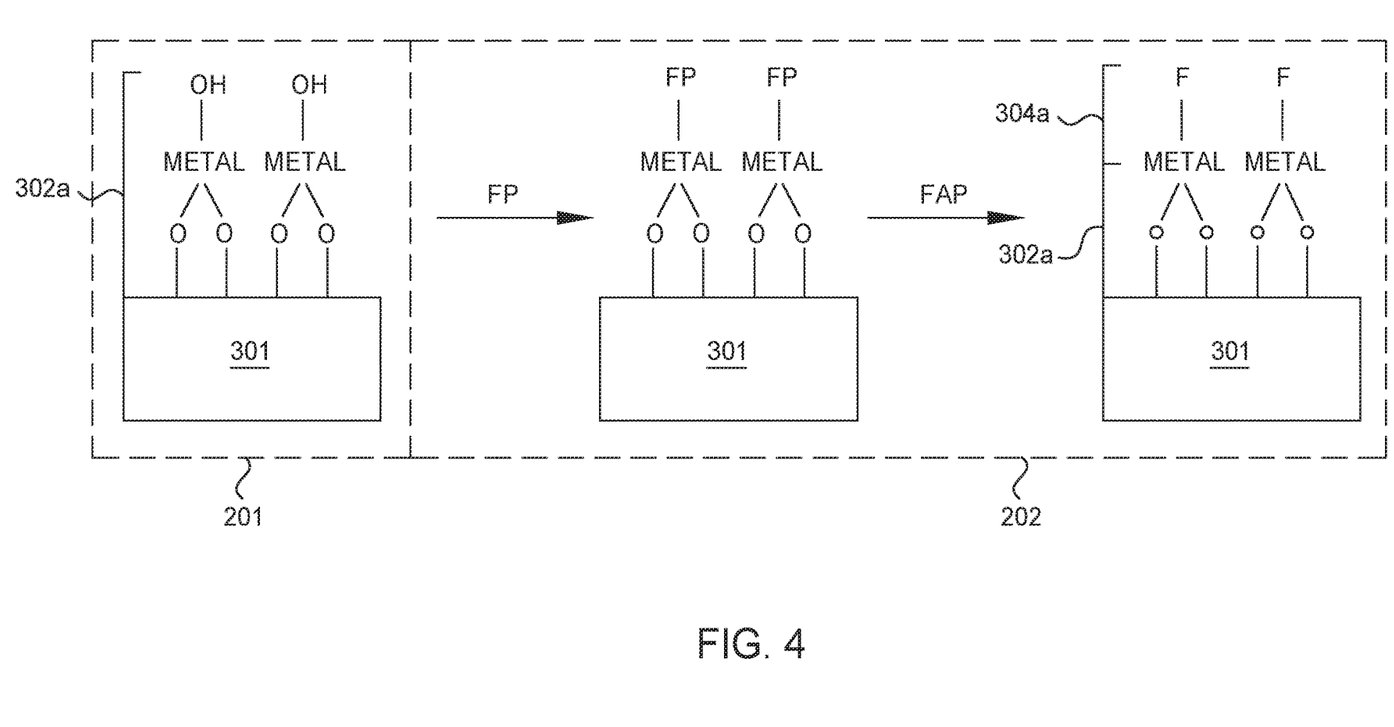
FIG. 4 is a schematic illustration of an activated fluorination process of a method of forming a fluorinated metal film according to an embodiment.

At operation 202, a first metal-fluorine layer 304a is deposited on the first metal-oxide containing layer 302a utilizing an activated fluorination process. metal-oxide containing layer As shown in FIG. 4, the activated fluorination process of operation 202 includes introducing a flow of fluorine precursor (FP) to the processing region 122. The FP flowing across the processing region 122 flows across the object 301. The FP reacts with terminal hydroxyl or other surface groups of the first metal-fluorine layer 304a and bonds with metals of the first metal-oxide containing layer 302a. In embodiments, which can be combined with other embodiments described herein, the FP includes at least one organofluorine reagent. Examples of organofluorine reagents include, but are not limited to, at least one of hexafluoro-acetylacetonate (HHFAC), tetrafluoroproanol (TFP), hexafluoropropanol (HFP), or 1,1,1,2-tetrafluoroethane (HFC-134). In embodiments, which can be combined with other embodiments described herein, the FP includes at least one fluorinated gas. Examples of fluorinated gases include, but are not limited to, at least one of nitrogen trifluoride ($NF_3$), phosphorus pentafluoride ($PF_5$), or sulfur hexafluoride ($SF_6$).

A flow of fluorination activation precursor (FAP) is provided to the processing region 122. The FAP flowing across the processing region 122 flows across the object 301, reacts with the FP bonded to the metals of the first metal-oxide containing layer 302a on the object 301, and forms a first metal-fluorine layer 304a on the first metal-oxide containing layer 302a. The first metal-fluorine layer 304a having fluorine bonded with terminal metals of the first metal-oxide containing layer 302a. In one embodiment, which can be combined with other embodiments described herein, the FAP includes at least one oxygen-containing precursor. Examples of oxygen-containing precursors include, but are not limited to, $H_2O$, ozone ($O_3$). In another embodiment, which can be combined with other embodiments described herein, the FAP includes an oxygen-containing plasma. The oxygen-containing plasma may be formed by flowing the oxygen-containing precursor across the processing region 122 and activating the oxygen-containing precursor into the oxygen-containing plasma. The oxygen-containing plasma may be formed in a remote plasma source that provides radicals of the oxygen-containing plasma to the processing region 122. In embodiments described herein, the FAP includes, but is not limited to, at least one of $H_2O$, $O_3$, $O_2$, or oxygen-radical containing plasma formed by one of microwave, RF, remote plasma, hot-wire, e-beam, and oxidizing or reducing plasma sources.

At operation 203, operations 201 and 202 are repeated to form a plurality of metal-oxide containing layers and metal-fluorine layers 302a, 304a, 302b, 304b, 302c, 304c, . . . , 302n, 304n until a fluorinated metal film 300 with a predetermined film thickness 310 is formed. In embodiments, which can be combined with other embodiments described herein, one of the metal-oxide containing layers 302a, 302b, 302c, 302n has a different predetermined layer thickness 306. The predetermined layer thickness 306 of each of the metal-oxide containing layers 302a, 302b, 302c, 302n provides for control of an fluorine to oxygen (O:F) ratio and the atomic percentage of oxygen of the fluorinated metal film 300. In a direct fluorination process, a fluorine precursor, such as HF or fluorine ($F_2$) is utilized directly as a fluorinating agent which may lead to uncontrolled fluorine diffusion. In an activated fluorination process, the FP reacts with the metal-oxide containing layers to create a surface adduct. The FAP reacts with the adduct and releases fluorine atoms from the FP in a controlled manner. The reaction of the adduct and release of the fluorine atoms facilitates control of the O:F ratio and the atomic percentage of oxygen of the fluorinated metal film 300. Controlling the O:F ratio and the atomic percentage of oxygen provide the ability to tune the corrosion resistance and application of the fluorinated metal film 300. In some embodiments, the O:F ratio is less than 1:1, such as less than 1:6. In some embodiments, the atomic percentage of oxygen is less than 20%, such as less than 10%. In one embodiment, which can be combined with other embodiments described herein, the metal-oxide containing layers 302a, 302b, 302c, 302n have an atomic percentage of oxygen, such that the fluorinated metal film 300 is consisting of pure metal-fluoride with less than 5% oxygen content, i.e., the atomic percentage of oxygen of the fluorinated metal film 300 is less than 5%. In another embodiment, which can be combined with other embodiments described herein, the metal-oxide containing layers 302a, 302b, 302c, 302n have an atomic percentage of oxygen, such that the fluorinated metal film 300 is consisting of pure metal-fluoride with less than 2% oxygen content, i.e, the atomic percentage of oxygen of the fluorinated metal film 300 is less than 2%.

In one embodiment, which can be combined with other embodiments described herein, a temperature in the processing region 122 is about 150° C. to 400° C. and a pressure in the processing region 122 is about 0.01 mbar to 100 mbar during the method 200. In one embodiment, which can be combined with other embodiments described herein, the temperature in the processing region 122 controls the O:F ratio and the atomic percentage of oxygen. For example, a temperature in the processing region 122 between about 250° C. and 300° C. results in the O:F ratio less than 1:2, the atomic percentage of oxygen less than 20%, and an atomic percentage of fluorine greater than 50%. In an exemplary embodiment of the method 200, which can be combined with other embodiments described herein, operation 201 includes introducing a flow of yttrium-containing precursor to the processing region 122 for about 1 millisecond (msec) to about 100 seconds (sec), introducing a flow of the purge gas to the processing region 122 for about 1 msec to about 1000 sec to purge the processing region 122, flowing and activating a precursor including at least on of $H_2O$, $O_3$, $O_2$ plasma, and $O_2$ in the processing region 122 for about 1 msec to about 100 sec, and introducing the flow of the purge gas to the processing region 122 for about 1 msec to about 1000 sec. Operation 202 includes introducing a FP to the processing region 122 for about 1 msec to about 100 sec, introducing the flow of the purge gas to the processing region 122 for about 1 msec to about 1000 sec, introducing a FAP to the processing region 122 for about 1 msec to about 100 sec, and introducing the flow of the purge gas to the processing region 122 for about 1 msec to about 1000 sec. Operations 201 and 202 are repeated until the fluorinated metal film 300 with the predetermined film thickness 310 is formed.

In summation, a method of forming a fluorinated metal film is provided. The utilization of the ALD process and the activated fluorination process provide for precise atomic control of the fluorinated metal film formed by repetition of the ALD process and the activated fluorination process. For example, the predetermined layer thickness of each of the metal-oxide containing layers controls the O:F ratio of the fluorinated metal film and the predetermined film thickness.

While the foregoing is directed to examples of the present disclosure, other and further examples of the disclosure may be devised without departing from the basic scope thereof, and the scope thereof is determined by the claims that follow.

What is claimed is:

1. A method of forming a fluorinated metal film, comprising:
positioning an object in an atomic layer deposition (ALD) chamber having a processing region;
depositing a metal-oxide containing layer on the object in the ALD chamber using an ALD process;
depositing a metal-fluorine layer on the metal-oxide containing layer using an activated fluorination process in the ALD chamber with the object disposed therein, the activated fluorination process comprising:
introducing a first flow of a fluorine precursor (FP) to the processing region, the FP comprising at least one organofluorine reagent or at least one fluorinated gas; and
introducing a second flow of a fluorination activation precursor (FAP) to the processing region after the first flow is discontinued; and
repeating the depositing the metal-oxide containing layer and the depositing the metal-fluorine layer with the activated fluorination process until the fluorinated metal film with a predetermined film thickness and an oxygen to fluorine ratio of less than 1:1 is formed.

2. The method of claim 1, wherein the ALD process comprises:
introducing a first flow of an oxygen-containing precursor to the processing region;
introducing a second flow of a metal-containing precursor to the processing region; and
repeating the introducing the first flow of the oxygen-containing precursor and the second flow of the metal-containing precursor until the metal-oxide containing layer with a predetermined layer thickness is formed.

3. The method of claim 2, wherein the metal-containing precursor is an aluminum-containing precursor.

4. The method of claim 1, wherein the FAP comprises at least one of $H_2O$, $O_3$, $O_2$, or oxygen-radical containing plasma formed by one of microwave, RF, remote plasma, hot-wire, e-beam, and oxidizing or reducing plasma sources.

5. The method of claim 1, wherein the metal-oxide containing layer has a predetermined layer thickness.

6. The method of claim 1, wherein the metal-oxide containing layer includes at least one of yttrium (Y), aluminum (Al), calcium (Ca), magnesium (Mg), strontium (Sr), barium (Ba), zinc (Zn), tin (Sn), gallium (Ga), indium (In), vanadium (V), manganese (Mn), cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), zirconium (Zr), or hafnium (Hf).

7. The method of claim 1, wherein the ALD process comprises:
introducing a first flow of a yttrium-containing precursor to the processing region;
introducing a second flow of an oxygen-containing precursor to the processing region; and
repeating the introducing the first flow of the yttrium-containing precursor and the introducing the second flow of the oxygen-containing precursor until the metal-oxide containing layer with a predetermined layer thickness is formed.

8. The method of claim 1, wherein the at least one organofluorine reagent comprises one or more of hexafluoro-acetylacetonate (HHFAC), tetrafluoropoanol (TFP), hexafluoropropanol (HFP), or 1,1,1,2-tetrafluoroethane (HFC-134).

9. The method of claim 1, wherein the at least one fluorinated gas comprises one or more of nitrogen trifluoride ($NF_3$), phosphorus pentafluoride ($PF_5$), or sulfur hexafluoride ($SF_6$).

10. A method of forming a fluorinated metal film, comprising:
depositing a metal-oxide containing layer on an object using a metal-oxide containing layer atomic layer deposition (ALD) process, the ALD process comprising:
positioning the object in an ALD chamber having a processing region;
introducing a first flow of an oxygen-containing precursor to the processing region;
introducing a second flow of a metal-containing precursor to the processing region; and
repeating the introducing the first flow of the oxygen-containing precursor and the second flow of the metal-containing precursor until the metal-oxide containing layer with a predetermined layer thickness is formed;
depositing a metal-fluorine layer on the metal-oxide containing layer using an activated fluorination process in the ALD chamber with the object disposed therein, the activated fluorination process comprising:
introducing a third flow of a fluorine precursor (FP) to the processing region, the FP comprising at least one organofluorine reagent or at least one fluorinated gas; and
introducing a fourth flow of a fluorination activation precursor (FAP) to the processing region after the third flow is discontinued; and
repeating the depositing the metal-oxide containing layer and the depositing the metal-fluorine layer with the activated fluorination process in the ALD chamber until the fluorinated metal film with a predetermined film thickness and an oxygen to fluorine ratio of less than 1:1 is formed.

11. The method of claim 10, wherein the metal-containing precursor is an aluminum-containing precursor.

12. The method of claim 10, wherein the metal-oxide containing layer includes at least one of yttrium (Y), aluminum (Al), calcium (Ca), magnesium (Mg), strontium (Sr), barium (Ba), zinc (Zn), tin (Sn), gallium (Ga), indium (In), vanadium (V), manganese (Mn), cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), zirconium (Zr), or hafnium (Hf).

13. The method of claim 10, wherein the FAP comprises at least one of $H_2O$, $O_3$, $O_2$, or oxygen-radical containing plasma formed by one of microwave, RF, remote plasma, hot-wire, e-beam, and oxidizing or reducing plasma sources.

14. The method of claim 10, wherein the at least one organofluorine reagent comprises one or more of hexafluoro-acetylacetonate (HHFAC), tetrafluoropoanol (TFP), hexafluoropropanol (HFP), or 1,1,1,2-tetrafluoroethane (HFC-134).

15. The method of claim 10, wherein the at least one fluorinated gas comprises one or more of nitrogen trifluoride ($NF_3$), phosphorus pentafluoride ($PF_5$), or sulfur hexafluoride ($SF_6$).

16. A method of forming a fluorinated metal film, comprising:
depositing a metal-oxide containing layer on an object using a metal-oxide containing layer atomic layer deposition (ALD) process, the ALD process comprising:

positioning the object in an ALD chamber having a processing region;
introducing a first flow of a yttrium-containing precursor to the processing region;
introducing a second flow of an oxygen-containing precursor to the processing region; and
repeating the introducing the first flow of the yttrium-containing precursor, and the introducing the second flow of the oxygen-containing precursor until the metal-oxide containing layer with a predetermined layer thickness is formed;
depositing a metal-fluorine layer on the metal-oxide containing layer using an activated fluorination process in the ALD chamber with the object disposed therein, the activated fluorination process comprising:
introducing a third flow of a fluorine precursor (FP) to the processing region, the FP comprising at least one organofluorine reagent or at least one fluorinated gas; and
introducing a fourth flow of a fluorination activation precursor (FAP) to the processing region after the third flow is discontinued; and
repeating the depositing the metal-oxide containing layer and the depositing the metal-fluorine layer with the activated fluorination process in the ALD chamber until the fluorinated metal film with a predetermined film thickness and an atomic percentage of oxygen of less than 20% is formed.

17. The method of claim 16, wherein the FAP comprises at least one of $H_2O$, $O_3$, $O_2$, or oxygen-radical containing plasma formed by one of microwave, RF, remote plasma, hot-wire, e-beam, and oxidizing or reducing plasma sources.

18. The method of claim 16, wherein the at least one organofluorine reagent comprises one or more of hexafluoro-acetylacetonate (HHFAC), tetrafluoropropanol (TFP), hexafluoropropanol (HFP), or 1,1,1,2-tetrafluoroethane (HFC-134).

* * * * *